United States Patent
Matsumura et al.

(10) Patent No.: US 9,362,961 B2
(45) Date of Patent: Jun. 7, 2016

(54) HIGH-FREQUENCY SIGNAL GENERATION CIRCUIT, TRANSMITTER, AND RECEIVER

(71) Applicant: FUJITSU LIMITED, Kawasaki-shi, Kanagawa (JP)

(72) Inventors: Hiroshi Matsumura, Isehara (JP); Toshihide Suzuki, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 77 days.

(21) Appl. No.: 14/449,483

(22) Filed: Aug. 1, 2014

(65) Prior Publication Data

US 2015/0072630 A1    Mar. 12, 2015

(30) Foreign Application Priority Data

Sep. 10, 2013   (JP) .................................. 2013-187123

(51) Int. Cl.
| | |
|---|---|
| H04B 1/40 | (2015.01) |
| H04B 1/04 | (2006.01) |
| H03L 7/24 | (2006.01) |
| H04B 1/16 | (2006.01) |
| H03L 7/06 | (2006.01) |
| H03L 7/08 | (2006.01) |

(52) U.S. Cl.
CPC .. *H04B 1/04* (2013.01); *H03L 7/24* (2013.01); *H04B 1/16* (2013.01); *H03L 7/06* (2013.01); *H03L 7/0805* (2013.01)

(58) Field of Classification Search
CPC ......... H03L 7/06; H03L 7/0802; H03L 7/099; H03L 7/24
USPC .......... 455/75, 76, 146, 147, 165.1, 255, 258, 455/260, 264, 265
See application file for complete search history.

(56) References Cited

U.S. PATENT DOCUMENTS

| | | | | |
|---|---|---|---|---|
| 8,258,882 B2* | 9/2012 | Shibasaki | ............. | H03L 7/0805 331/117 FE |
| 8,712,357 B2* | 4/2014 | Panikkath | ............. | G01R 13/02 455/118 |
| 8,811,926 B2* | 8/2014 | Otis et al. | .................. | G06F 7/68 327/112 |
| 2002/0039039 A1* | 4/2002 | Maligeorgos | .......... | H03B 19/14 327/116 |

(Continued)

FOREIGN PATENT DOCUMENTS

| | | |
|---|---|---|
| JP | 62-47212 | 2/1987 |
| JP | 2006-94333 | 4/2006 |

(Continued)

OTHER PUBLICATIONS

EESR—The Extended European Search Report issued on Nov. 26, 2014 for corresponding European Application No. 14179148.3.
US2009/0175116A1 cited in the above EESR was previously submitted in the IDS filed on Aug. 1, 2014.

*Primary Examiner* — Duc M Nguyen
(74) *Attorney, Agent, or Firm* — Fujitsu Patent Center (57) ABSTRACT

A voltage controlled oscillator outputs an output signal whose frequency corresponds to inputted control voltage. A distributor distributes the output signal outputted from the voltage controlled oscillator. A plurality of injection-locked oscillators regulate self-oscillation frequencies according to the above frequency and output signals obtained by frequency-multiplying signals distributed by the distributor. A combiner combines and outputs the signals outputted from the plurality of injection-locked oscillators. This makes it possible to increase output power while preventing an operating band from narrowing.

3 Claims, 12 Drawing Sheets

(56) References Cited

U.S. PATENT DOCUMENTS

| | | | |
|---|---|---|---|
| 2004/0008092 A1* | 1/2004 | Hajimiri | H03B 27/00 331/117 R |
| 2004/0189404 A1* | 9/2004 | Ravi | H03B 27/00 331/45 |
| 2007/0063779 A1* | 3/2007 | Kanda | G06F 1/04 331/167 |
| 2008/0122501 A1* | 5/2008 | Narusawa | G06F 1/12 327/144 |
| 2009/0081961 A1* | 3/2009 | Rofougaran | H03L 7/24 455/76 |
| 2009/0088091 A1* | 4/2009 | Shen | H04B 1/0483 455/102 |
| 2009/0175116 A1 | 7/2009 | Song et al. | |
| 2010/0112965 A1* | 5/2010 | Buccafusca | H04L 27/2601 455/114.1 |
| 2013/0058384 A1* | 3/2013 | Otis | G06F 7/68 375/219 |
| 2014/0235186 A1* | 8/2014 | Belot | H04B 1/406 455/125 |

FOREIGN PATENT DOCUMENTS

| | | |
|---|---|---|
| JP | 2009-165109 | 7/2009 |
| JP | 2013-17067 | 1/2013 |
| WO | 2012/111131 A1 | 8/2012 |

\* cited by examiner

HIGH-FREQUENCY SIGNAL GENERATION CIRCUIT, TRANSMITTER, AND RECEIVER

CROSS-REFERENCE TO RELATED APPLICATION

This application is based upon and claims the benefit of priority of the prior Japanese Patent Application No. 2013-187123, filed on Sep. 10, 2013, the entire contents of which are incorporated herein by reference.

FIELD

The embodiment discussed herein is related to a high-frequency signal generation circuit, a transmitter, and a receiver.

BACKGROUND

In recent years high-frequency signal generation circuits which generate signals (high-frequency signals), such as millimeter waves, having high frequencies have been used in radars and communication apparatus which perform radio communication.

With high-frequency signal generation circuits it is difficult to directly generate high-frequency signals, such as millimeter waves, by the use of a voltage controlled oscillator (hereinafter referred to as a VCO). Accordingly, after a signal whose frequency is comparatively low is generated by the use of a VCO, the frequency of the signal outputted from the VCO is multiplied by an integer by the use of a frequency multiplier. By doing so, a millimeter-wave carrier signal is obtained.

However, output power of the frequency multiplier is low, so a power amplifier is used for obtaining high output power. Furthermore, a gain amplifier is used for compensating for a change in the gain of the power amplifier or the like caused by a change in its temperature. In order to compensate for a change in the gain of the power amplifier or the like caused by a change in its temperature, a gain amplifier whose gain is high enough to make up for a drop in the gain of the power amplifier or the like is used. This increases power consumption.

Japanese Laid-open Patent Publication No. 62-47212
Japanese Laid-open Patent Publication No. 2009-165109

In order to check an increase in power consumption, an injection-locked oscillator (ILO) may be connected at a subsequent stage of the VCO. An injection-locked oscillator has the function of a frequency multiplier. In addition, output power of an injection-locked oscillator does not depend on the power of an input signal (referred to as an injected signal) and a change in output voltage of an injection-locked oscillator caused by a change in ambient temperature is slight. This avoids the necessity of using a gain amplifier which is used for compensating for a change in output voltage caused by a change in ambient temperature. As a result, power consumption is reduced.

If an injection-locked oscillator is used in a high-frequency signal generation circuit, a transistor whose gate width is narrow may be used in order to reduce parasitic capacitance. In that case, however, it is difficult to obtain high output power. In order to obtain high output power, a plurality of injection-locked oscillators may be connected in parallel and output of them may be combined. However, the power of an injected signal becomes lower and an operating band becomes narrower.

SUMMARY

According to an aspect, there is provided a high-frequency signal generation circuit including a voltage controlled oscillator which outputs an output signal whose frequency corresponds to inputted control voltage, a distributor which distributes the output signal outputted from the voltage controlled oscillator, a plurality of injection-locked oscillators each of which regulates a self-oscillation frequency according to the frequency and which output signals obtained by frequency-multiplying signals distributed by the distributor, and a combiner which combines and outputs the signals outputted from the plurality of injection-locked oscillators.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will now be described with reference to the accompanying drawings, wherein like reference numerals refer to like elements throughout.

Figure 1A:
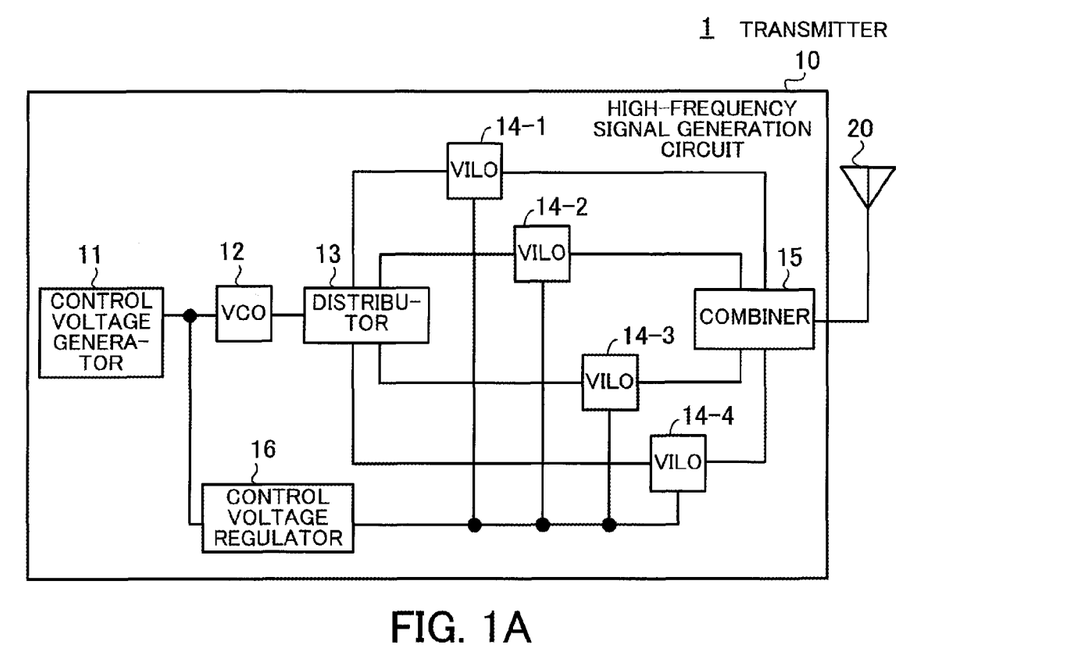
FIGS. 1A and 1B illustrate an example of a high-frequency signal generation circuit according to an embodiment and indicates an example of the relationship between an input frequency of each VILO and minimum injected power for synchronous oscillation.

FIG. 1A illustrates an example of a high-frequency signal generation circuit according to an embodiment.

In the example of FIG. 1A, a high-frequency signal generation circuit 10 is applied to a transmitter 1 which transmits a generated high-frequency signal via an antenna 20. The transmitter 1 is, for example, a radar in a vehicle and outputs a transmitted signal in, for example, the wide 76-81 GHz band whose frequency continuously changes for determining the distance between the vehicle and another vehicle or a relative speed from the relationship between the transmitted signal and a received signal which is a reflected wave.

The high-frequency signal generation circuit 10 can also be applied to an apparatus other than the transmitter 1. Examples will be described later.

The high-frequency signal generation circuit 10 includes a control voltage generator 11, a VCO 12, a distributor 13, a plurality of injection-locked oscillators each having the function of regulating a self-oscillation frequency (hereinafter referred to as the VILOs) 14-1, 14-2, 14-3, and 14-4, a combiner 15, and a control voltage regulator 16.

The control voltage generator 11 generates control voltage corresponding to a frequency generated by the VCO 12. The control voltage generator 11 may be placed outside the high-frequency signal generation circuit 10.

The VCO 12 outputs a signal having a determined frequency corresponding to inputted control voltage.

The distributor 13 distributes a signal outputted from the VCO 12 to the VILOs 14-1 through 14-4 as injected signals.

Each of the VILOs 14-1 through 14-4 regulates a self-oscillation frequency according to the frequency of an injected signal inputted and frequency-multiplies the injected signal inputted. A self-oscillation frequency is an oscillation frequency at which the sensitivity of a VILO to the power of an injected signal (hereinafter referred to as injected power) is highest.

In addition, output power of each of the VILOs 14-1 through 14-4 does not depend on injected power and a change in output voltage of each of the VILOs 14-1 through 14-4 caused by a change in ambient temperature is slight. With the high-frequency signal generation circuit according to the embodiment each of the VILOs 14-1 through 14-4 controls a self-oscillation frequency on the basis of control voltage by which an output frequency of the VCO 12 is controlled. By doing so, each of the VILOs 14-1 through 14-4 obtains a self-oscillation frequency corresponding to the output frequency (which is the frequency of an injected signal).

In the example of the embodiment, however, control voltage is regulated by the control voltage regulator 16 described later and is supplied to the VILOs 14-1 through 14-4.

The combiner 15 combines and outputs signals outputted from the VILOs 14-1 through 14-4.

The control voltage regulator 16 regulates control voltage on the basis of the control voltage-oscillation frequency characteristics of the VILOs 14-1 through 14-4 and the VCO 12 so that each of the VILOs 14-1 through 14-4 can obtain a self-oscillation frequency M (≥2) times an output frequency of the VCO 12. The control voltage regulator 16 is, for example, a level shifter.

Figure 1B:
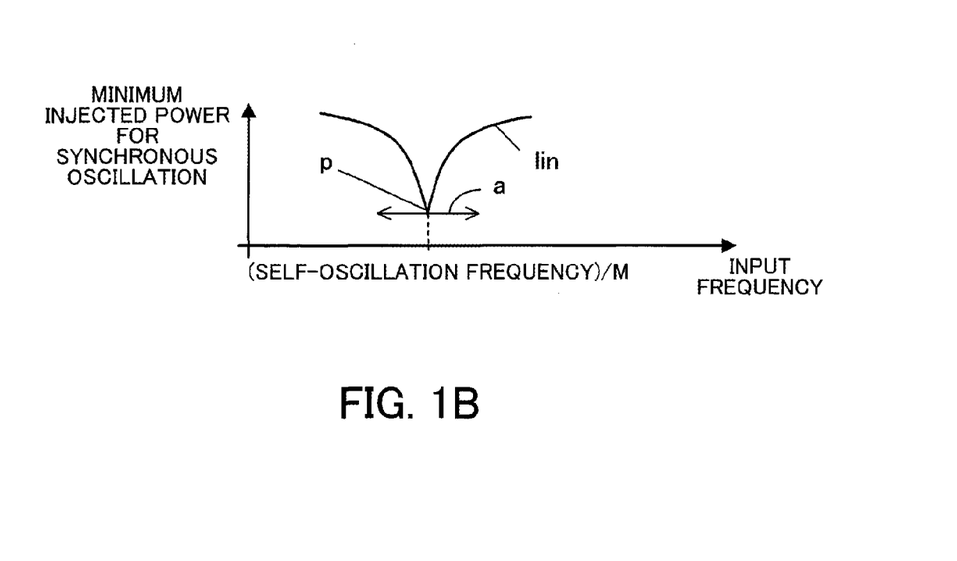

FIG. 1B indicates an example of the relationship between an input frequency of each of the VILOs 14-1 through 14-4 and minimum injected power for a synchronous oscillation. In FIG. 1B, a horizontal axis indicates an input frequency (output frequency of the VCO 12) and a vertical axis indicates minimum injected power for synchronous oscillation.

If a self-oscillation frequency is fixed, even low injected power causes a synchronous oscillation at an input frequency close to (self-oscillation frequency)/M (M is an integer greater than or equal to 2). However, minimum injected power which causes a synchronous oscillation becomes higher at an input frequency not close to (self-oscillation frequency)/M. That is to say, low injected power does not cause a synchronous oscillation.

In the embodiment, on the other hand, a self-oscillation frequency is regulated according to an input frequency and a characteristic curve lin illustrated in FIG. 1B is changed. Even if minimum injected power is low, a synchronous oscillation occurs in a wide band by shifting a peak p of the characteristic curve lin in the direction of an arrow a.

That is to say, in order to obtain high output power, the VILOs 14-1 through 14-4 are connected in parallel. This lowers injected power, but this prevents an operating band from narrowing. Accordingly, an operating band is prevented from narrowing, and output power is increased.

In addition, a change in output voltage of each of the VILOs 14-1 through 14-4 caused by a change in ambient temperature is slight, so there is no need for using a gain amplifier which is used for compensating for a change in output voltage. As a result, power consumption is reduced.

With the transmitter 1 illustrated in FIG. 1A, power consumption is low and a wideband and high-power transmitted signal is outputted.

In the example of FIG. 1A, the high-frequency signal generation circuit 10 including the four VILOs 14-1 through 14-4 is illustrated. However, the number of VILOs is not limited to four. That is to say, the high-frequency signal generation circuit 10 includes more than one VILO.

A high-frequency signal generation circuit in which ILOs are used will be taken as an example for comparison and the high-frequency signal generation circuit 10 according to the embodiment will be described in further detail.

Example for Comparison

Figure 2:
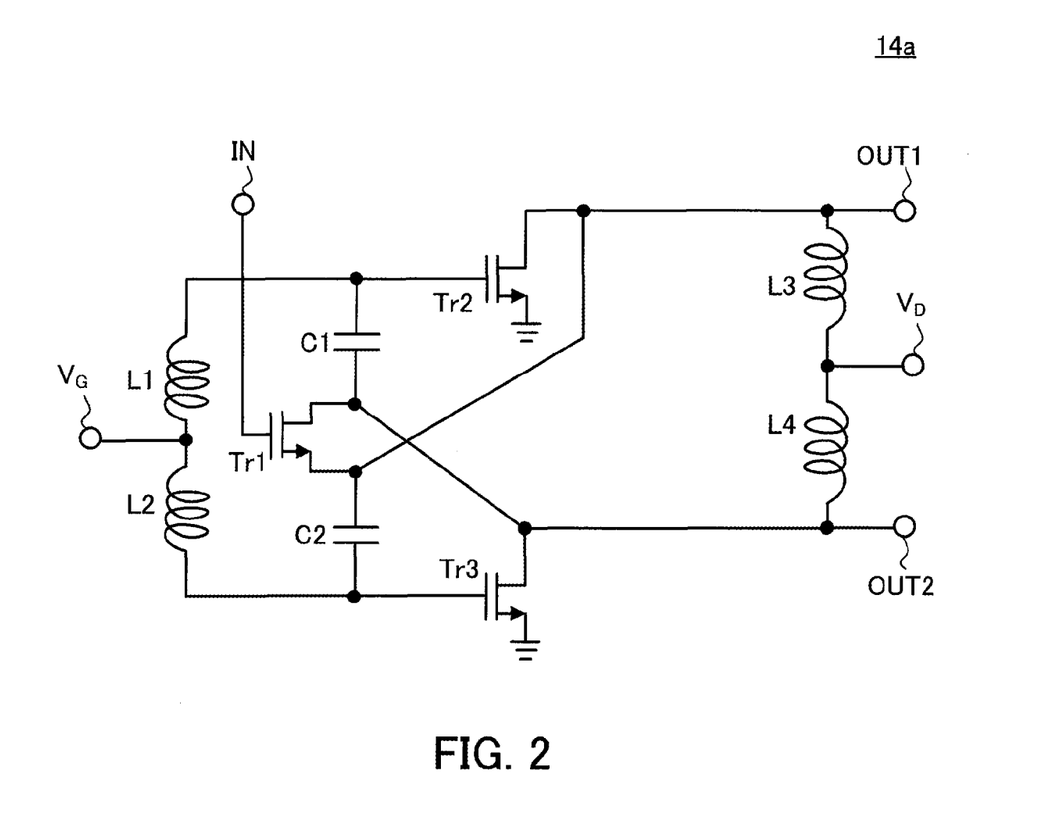
FIG. 2 illustrates an example of an ILO.

FIG. 2 illustrates an example of an ILO.

An ILO 14a includes inductors L1, L2, L3, and L4, capacitances C1 and C2, and transistors Tr1, Tr2, and Tr3. In the example of FIG. 2, the transistors Tr1, Tr2, and Tr3 are n-channel MOSFETs (Metal-Oxide Semiconductor Field Effect Transistors).

A gate of the transistor Tr1 is connected to a terminal IN from which an injected signal is inputted. A drain of the transistor Tr1 is connected to one terminal of the capacitance C1 and a drain of the transistor Tr3. A source of the transistor Tr1 is connected to one terminal of the capacitance C2 and a drain of the transistor Tr2.

A gate of the transistor Tr2 is connected to the other terminal of the capacitance C1 and is connected via the inductor L1 to a terminal $V_G$ from which gate voltage is inputted. A drain of the transistor Tr2 is connected to a terminal OUT1 and is connected via the inductor L3 to a terminal $V_D$ from which drain voltage is inputted. A source of the transistor Tr2 is grounded.

A gate of the transistor Tr3 is connected to the other terminal of the capacitance C2 and is connected via the inductor L2 to the terminal $V_G$. A drain of the transistor Tr3 is connected to a terminal OUT2 and is connected via the inductor L4 to the terminal $V_D$. A source of the transistor Tr3 is grounded. Output signals (oscillation signals) whose phases are opposite to each other are outputted from the terminals OUT1 and OUT2.

In the above ILO 14a a self-oscillation frequency fs is approximated by the following expression (1):

$$f_s \approx \frac{1}{2\pi\sqrt{L(C+C_{gs})}} \quad (1)$$

where L is the inductance values of the inductors L1 through L4, C is the capacitance values of the capacitances C1 and C2, and $C_{gs}$ is the parasitic capacitance (gate-source capacitance) of the transistors Tr2 and Tr3.

In order to obtain a high oscillation frequency like that of a millimeter wave by the ILO 14a illustrated in FIG. 2, the parasitic capacitance $C_{gs}$ in expression (1) is made low. In order to make the parasitic capacitance $C_{gs}$ low, transistors in which gate width is small may be used. In that case, however, it is difficult to obtain high output power.

Therefore, the following high-frequency signal generation circuit may be used.

Figure 3:
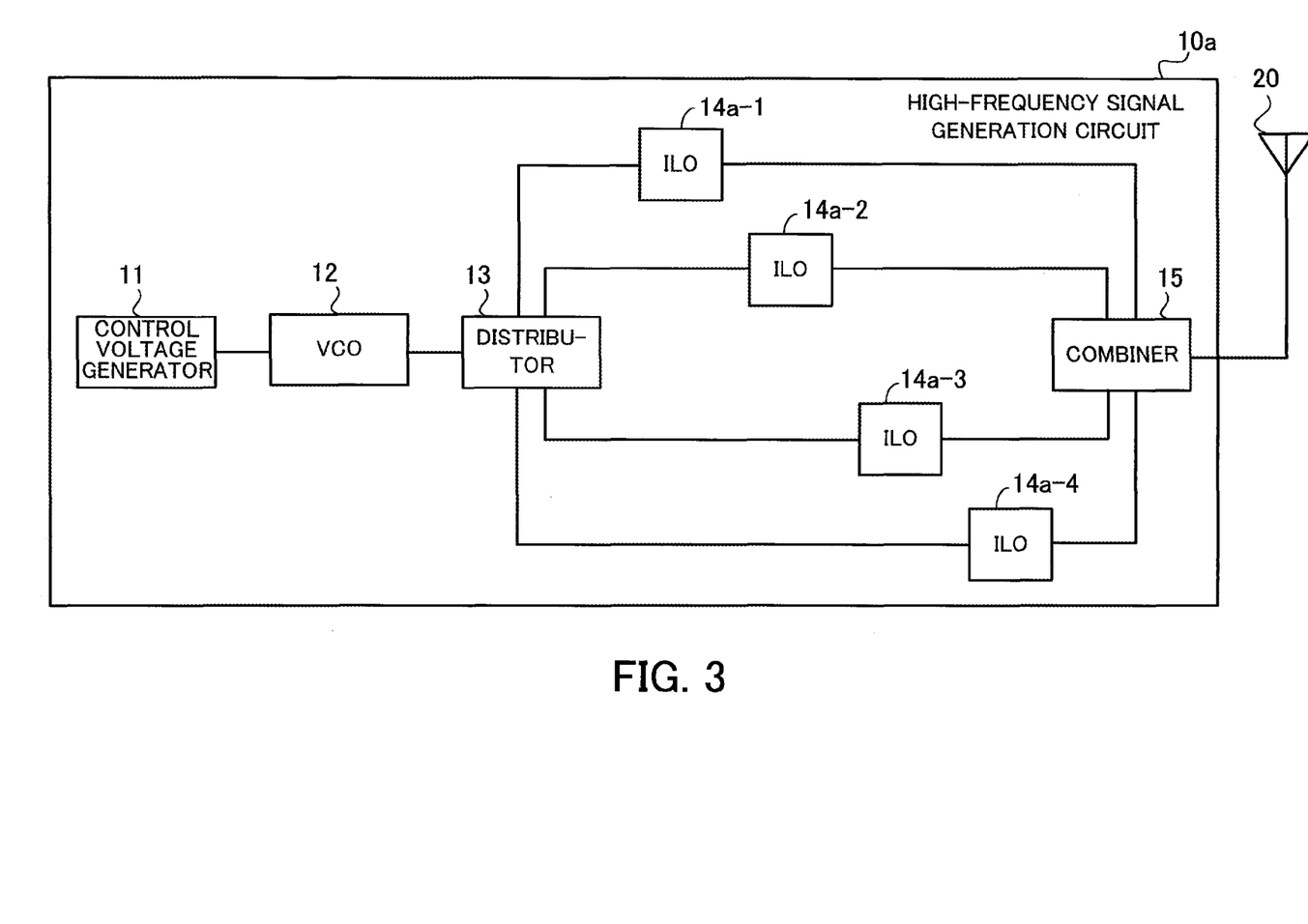
FIG. 3 illustrates an example of a high-frequency signal generation circuit for comparison.

FIG. 3 illustrates an example of a high-frequency signal generation circuit for comparison. Components in FIG. 3 which are the same as those illustrated in FIG. 1A are marked with the same numerals.

With a high-frequency signal generation circuit 10a a distributor 13 distributes a signal outputted from a VCO 12 to ILOs 14a-1 through 14a-4 as injected signals. A combiner 15 then combines and outputs signals outputted from the ILOs 14a-1 through 14a-4.

With the above high-frequency signal generation circuit 10a the ILOs 14a-1 through 14a-4 are connected in parallel. When the number of the ILOs 14a-1 through 14a-4 connected in parallel is large, injected power to each of the ILOs 14a-1 through 14a-4 is low. However, if injected power is sufficient for synchronous oscillation, output power does not depend on the injected power from the viewpoint of the characteristic of an ILO. Therefore, as the number of ILOs connected in parallel increases, higher output power is obtained.

However, if the number of ILOs connected in parallel is large and injected power to each of the ILOs is low, an operating band is narrow.

Figure 4:
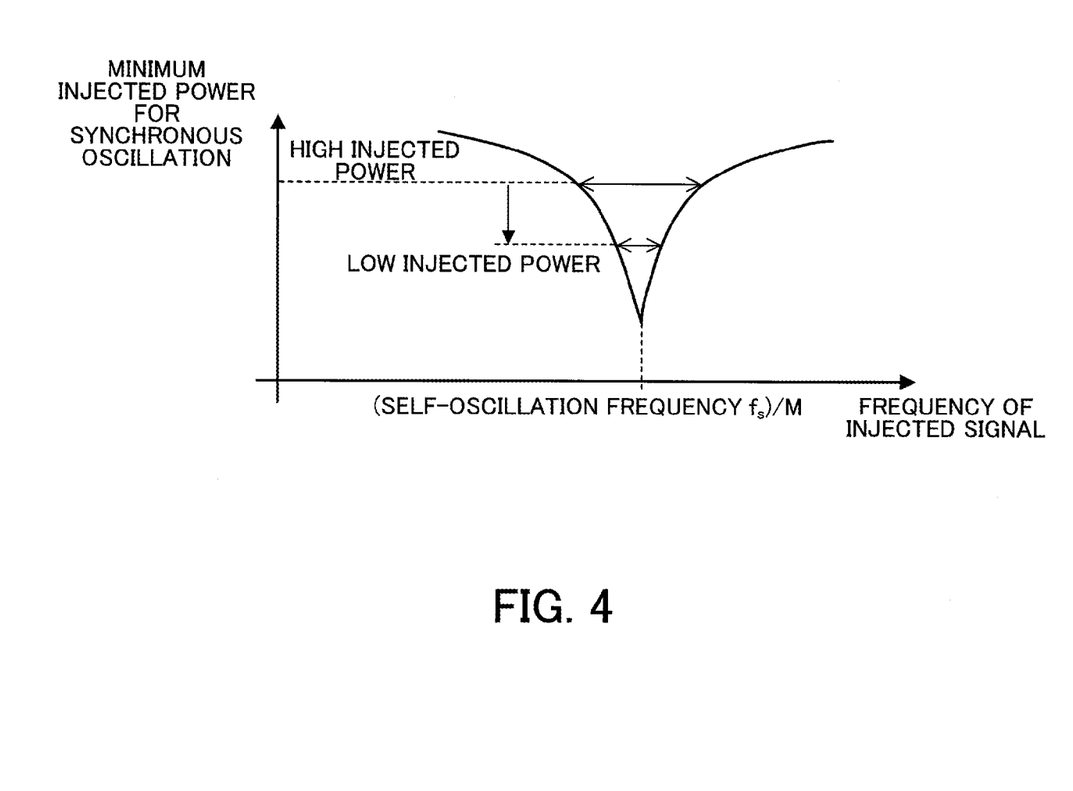
FIG. 4 indicates an example of the input sensitivity characteristic of an ILO.

FIG. 4 indicates an example of the input sensitivity characteristic of an ILO. In FIG. 4, a horizontal axis indicates the frequency of an injected signal and a vertical axis indicates minimum injected power (corresponding to input sensitivity) for synchronous oscillation.

Even if there is no injected signal, an ILO self-oscillates at a self-oscillation frequency $f_S$. When the frequency of an injected signal is equal to (self-oscillation frequency $f_S$)/M (M is an integer greater than or equal to 2), the sensitivity is highest and a low-power injected signal causes synchronous oscillation. As the difference between the frequency of an injected signal and $f_S$/M becomes larger, the sensitivity decreases rapidly. Therefore, when injected power is low, an operating band is narrow.

Accordingly, as illustrated in FIGS. 1A and 1B, the high-frequency signal generation circuit 10 according to the embodiment includes the VILOs 14-1 through 14-4 each of which regulates a self-oscillation frequency according to the frequency of an injected signal. By regulating a self-oscillation frequency to obtain a frequency M times the frequency of the injected signal, sensitivity to the injected signal is kept highest. The VILOs 14-1 through 14-4 are connected in parallel. This lowers injected power, but this prevents an operating band from narrowing.

In addition, the number of the VILOs 14-1 through 14-4 connected in parallel can be increased, so output power can be increased.

Figure 5:
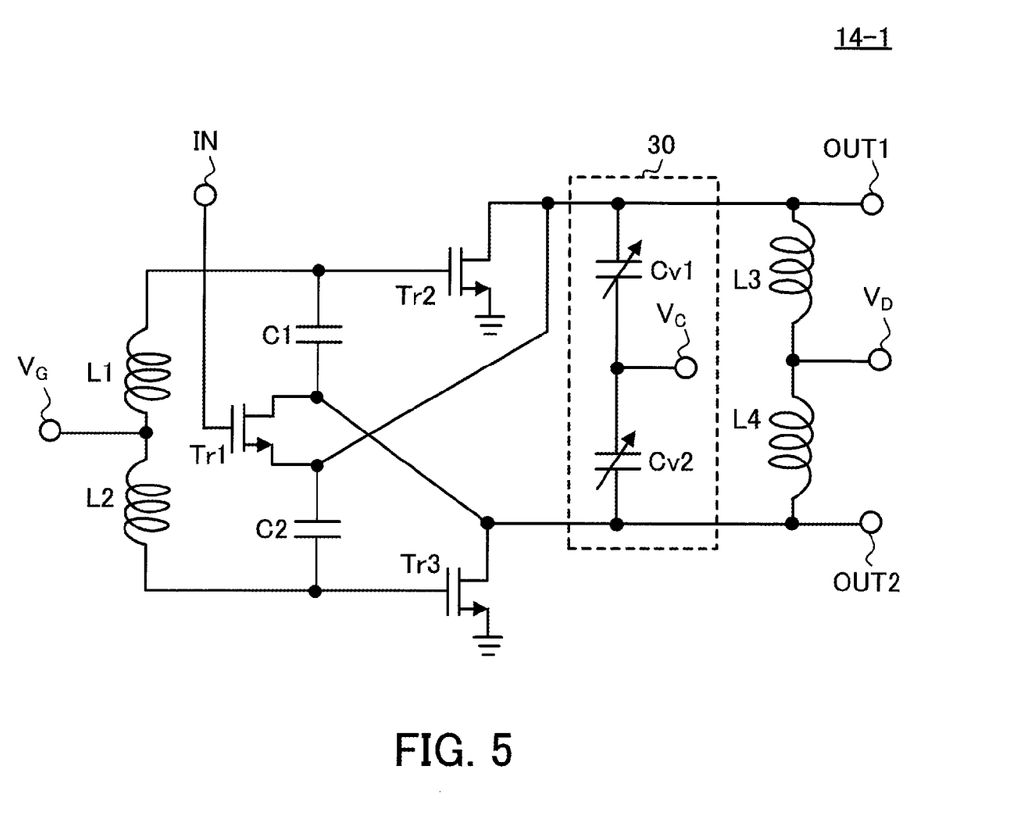
FIG. 5 illustrates an example of a VILO included in the high-frequency signal generation circuit according to the embodiment.

The high-frequency signal generation circuit according to the embodiment will now be described. FIG. 5 illustrates an example of the VILO included in the high-frequency signal generation circuit according to the embodiment. Components in FIG. 5 which are the same as those included in the ILO 14a illustrated in FIG. 2 are marked with the same numerals. Furthermore, FIG. 5 illustrates an example of the VILO 14-1. However, the other VILOs 14-2 through 14-4 are also realized by using the same circuit.

Unlike the ILO 14a illustrated in FIG. 2, the VILO 14-1 includes a control circuit 30 which controls a self-oscillation frequency. The control circuit 30 includes variable capacitance elements Cv1 and Cv2 connected in series between a terminal OUT1 and a terminal OUT2. The variable capacitance elements Cv1 and Cv2 are, for example, varactor diodes. The capacitance values of the variable capacitance elements Cv1 and Cv2 change according to control voltage inputted to a control terminal $V_C$ connected between the variable capacitance elements Cv1 and Cv2. In this case, the control voltage is regulated by a control voltage regulator 16.

In the above VILO 14-1, a self-oscillation frequency $f_{SS}$ is approximated by the following expression (2):

$$f_{ss} \approx \frac{1}{2\pi\sqrt{L(C + C_{var} + C_{gs})}} \quad (2)$$

where L is the inductance values of inductors L1 through L4, C is the capacitance values of capacitances C1 and C2, $C_{gs}$ is the parasitic capacitance values (gate-source capacitance values) of transistors Tr2 and Tr3, and $C_{var}$ is the capacitance values of the variable capacitance elements Cv1 and Cv2.

In order to make the self-oscillation frequency $f_{SS}$ equal to M times the frequency of an injected signal, $C_{var}$ is controlled by control voltage inputted to the control terminal $V_C$. As stated above, this keeps sensitivity to the injected signal highest and prevents an operating band from narrowing.

A control voltage regulation method by the control voltage regulator 16 will now be described.

(Control Voltage Regulation Method)

The input-output characteristic of the control voltage regulator 16 is expressed by the following expression (3):

$$V_{out} = G_{LS} \cdot V_{in} + V_{offset} \quad (3)$$

where $V_{out}$ and $V_{in}$ indicate voltage outputted from the control voltage regulator 16 and voltage inputted to the control voltage regulator 16, respectively, $G_{LS}$ and $V_{offset}$ indicate the gain and an offset component, respectively, of the control voltage regulator 16.

$G_{LS}$ and $V_{offset}$ are found in the following way on the basis of the control voltage-oscillation frequency characteristics of the VILOs 14-1 through 14-4 and the VCO 12.

Figure 6:
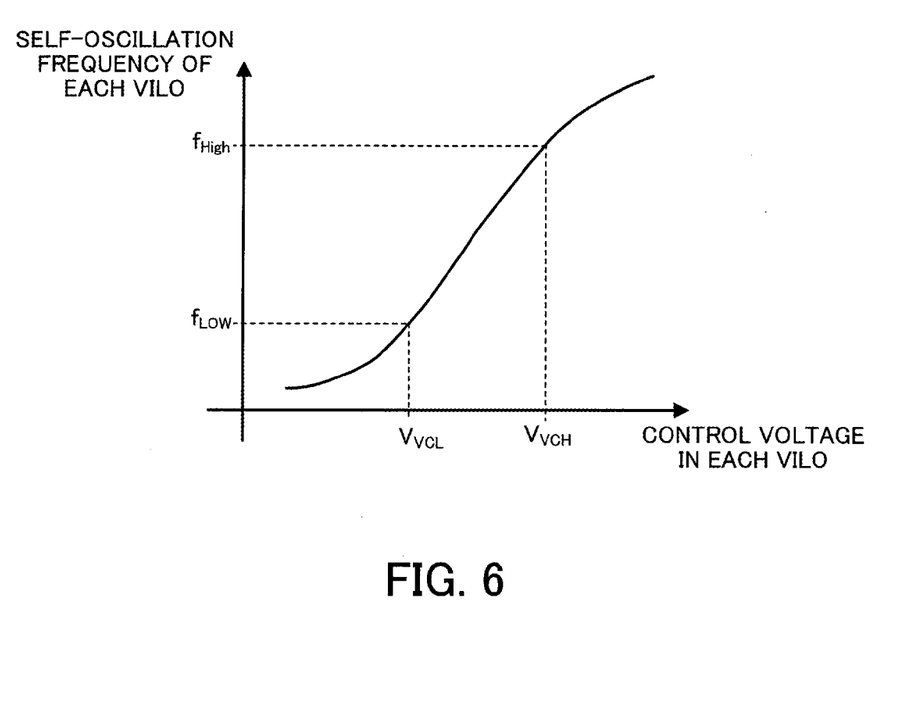
FIG. 6 indicates an example of the control voltage-self-oscillation frequency characteristic of each VILO.

FIG. 6 indicates an example of the control voltage-self-oscillation frequency characteristic of each of the VILOs. In FIG. 6, a horizontal axis indicates control voltage in the VILOs 14-1 through 14-4 and a vertical axis indicates self-oscillation frequencies of the VILOs 14-1 through 14-4.

Figure 7:
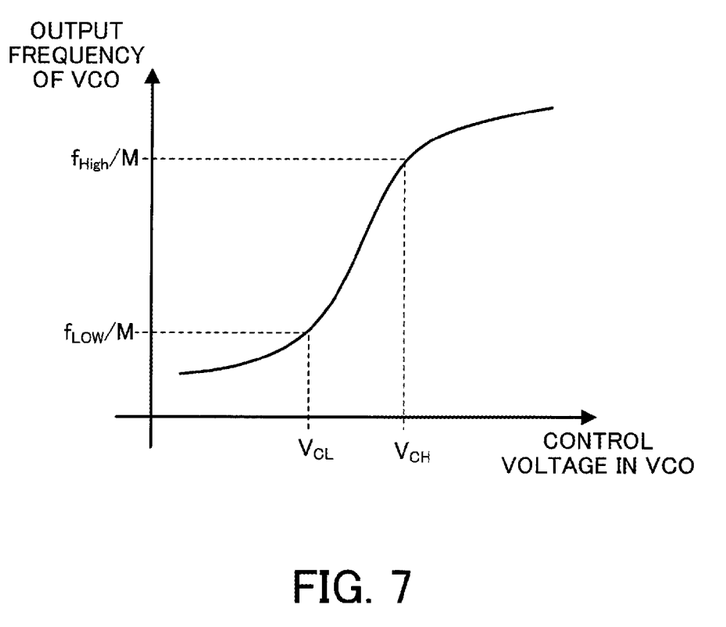
FIG. 7 indicates an example of the control voltage-output frequency characteristic of a VCO.

On the other hand, FIG. 7 indicates an example of the control voltage-output frequency characteristic of the VCO. In FIG. 7, a horizontal axis indicates control voltage in the VCO 12 and a vertical axis indicates an output frequency (oscillation frequency) of the VCO 12.

For example, the characteristics indicated in FIGS. 6 and 7 are measured in advance at the time of inspection before product shipment.

It is assumed that an operating band of the high-frequency signal generation circuit 10 is frequencies $f_{LOW}$ to $f_{High}$. As indicated in FIG. 6, control voltage at which the self-oscillation frequencies of the VILOs 14-1 through 14-4 are the frequencies $f_{LOW}$ and $f_{High}$ are voltage $V_{VCL}$ and voltage $V_{VCH}$ respectively.

On the other hand, output frequencies of the VCO 12 at which output frequencies of the high-frequency signal generation circuit 10 are the frequencies $f_{LOW}$ and $f_{High}$ are $f_{LOW}$/M (M is an integer greater than or equal to 2) and $f_{High}$/M respectively. As can be seen from FIG. 7, control voltage in the VCO 12 for obtaining the output frequencies $f_{LOW}$/M and $f_{High}$/M are voltage $V_{CL}$ and voltage $V_{CH}$ respectively.

On the basis of the above characteristics, $G_{LS}$ and $V_{offset}$ in expression (3) are found from the simultaneous equations:

$$V_{VCL} = G_{LS} \cdot V_{CL} + V_{offset} \quad (4)$$

$$V_{VCH} = G_{LS} \cdot V_{CH} + V_{offset} \quad (5)$$

It is assumed that an operating band of the high-frequency signal generation circuit 10 is 76 to 81 GHz, and determining the gain and an offset component of the control voltage regulator 16 will now be described as an example.

Figure 8:
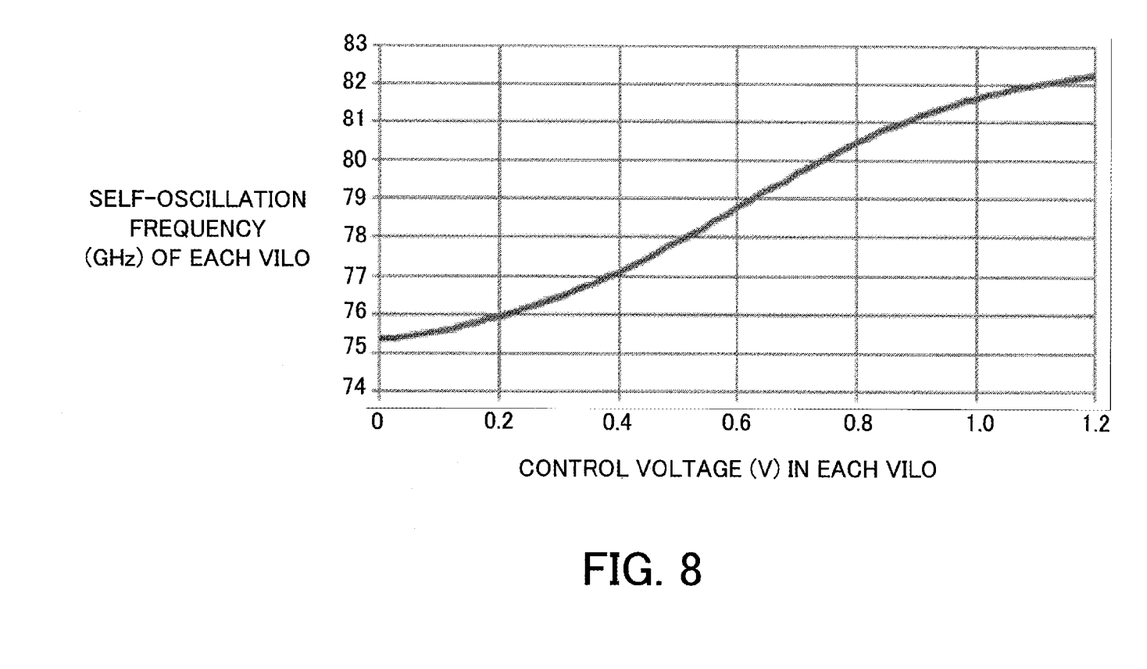
FIG. 8 indicates an example of the control voltage-self-oscillation frequency characteristic of each VILO.

FIG. 8 indicates an example of the control voltage-self-oscillation frequency characteristic of each of the VILOs. In FIG. 8, a horizontal axis indicates control voltage (V) in the VILOs 14-1 through 14-4 and a vertical axis indicates self-oscillation frequencies (GHz) of the VILOs 14-1 through 14-4.

Figure 9:
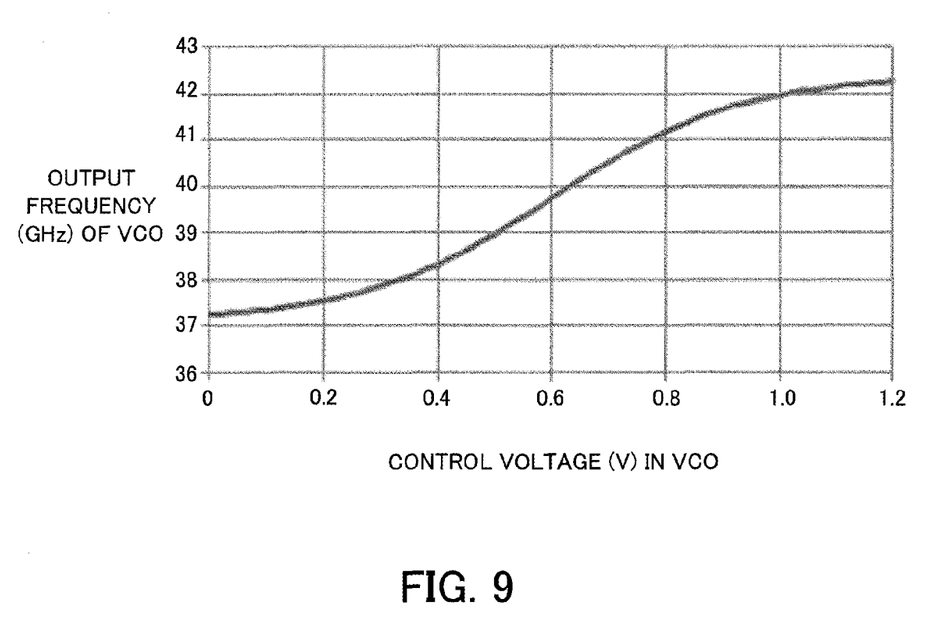
FIG. 9 indicates an example of the control voltage-output frequency characteristic of a VCO.

On the other hand, FIG. 9 indicates an example of the control voltage-output frequency characteristic of the VCO. In FIG. 9, a horizontal axis indicates control voltage (V) in the VCO 12 and a vertical axis indicates output frequency (GHz) of the VCO 12.

When an operating band of the high-frequency signal generation circuit 10 is 76 to 81 GHz, control voltage at which the self-oscillation frequencies of the VILOs 14-1 through 14-4 are 76 GHz and 81 GHz are 0.22 V and 0.88 V, respectively, from the characteristics indicated in FIG. 8.

Therefore, the self-oscillation frequencies of the VILOs 14-1 through 14-4 are regulated in the range of 76 to 81 GHz by changing control voltage in the VILOs 14-1 through 14-4 in the range of 0.22 to 0.88 V.

On the other hand, when output frequencies of the high-frequency signal generation circuit 10 are 76 GHz and 81 GHz, output frequencies of the VCO 12 are 76/M (M is an integer greater than or equal to 2) GHz and 81/M GHz. It is assumed that M=2. When output frequencies of the high-frequency signal generation circuit 10 are 76 GHz and 81 GHz, output frequencies of the VCO 12 are 38 GHz and 40.5 GHz. In order to obtain the output frequencies 38 GHz and 40.5 GHz, control voltage in the VCO 12 are 0.34 V and 0.70 V, respectively, from the characteristic indicated in FIG. 9.

Accordingly, the simultaneous equations given by expressions (4) and (5) are expressed as:

$$0.22 = G_{LS} \times 0.34 + V_{offset}$$

$$0.88 = G_{LS} \times 0.70 + V_{offset}$$

When these simultaneous equations are solved, $G_{LS} \approx 1.8$ and $V_{offset} \approx -0.40$. Therefore, a design for the control voltage regulator 16 is made so that its input-output characteristic will be expressed as $$V_{out} = 1.8 \times V_{in} - 0.4$$

This makes it possible to regulate control voltage so as to make the self-oscillation frequencies equal to twice the frequency of an injected signal.

As a result, high sensitivity is kept in the range of 76 to 81 GHz and an operating band is not narrowed. A high-power high-frequency signal whose frequency continuously changes in the range of 76 to 81 GHz is outputted.

Another Example

In the above description the high-frequency signal generation circuit 10 is applied to a transmitter. However, the high-frequency signal generation circuit 10 may be applied to another apparatus. For example, the high-frequency signal generation circuit 10 may be applied to a received local signal source in a receiver.

Figure 10:
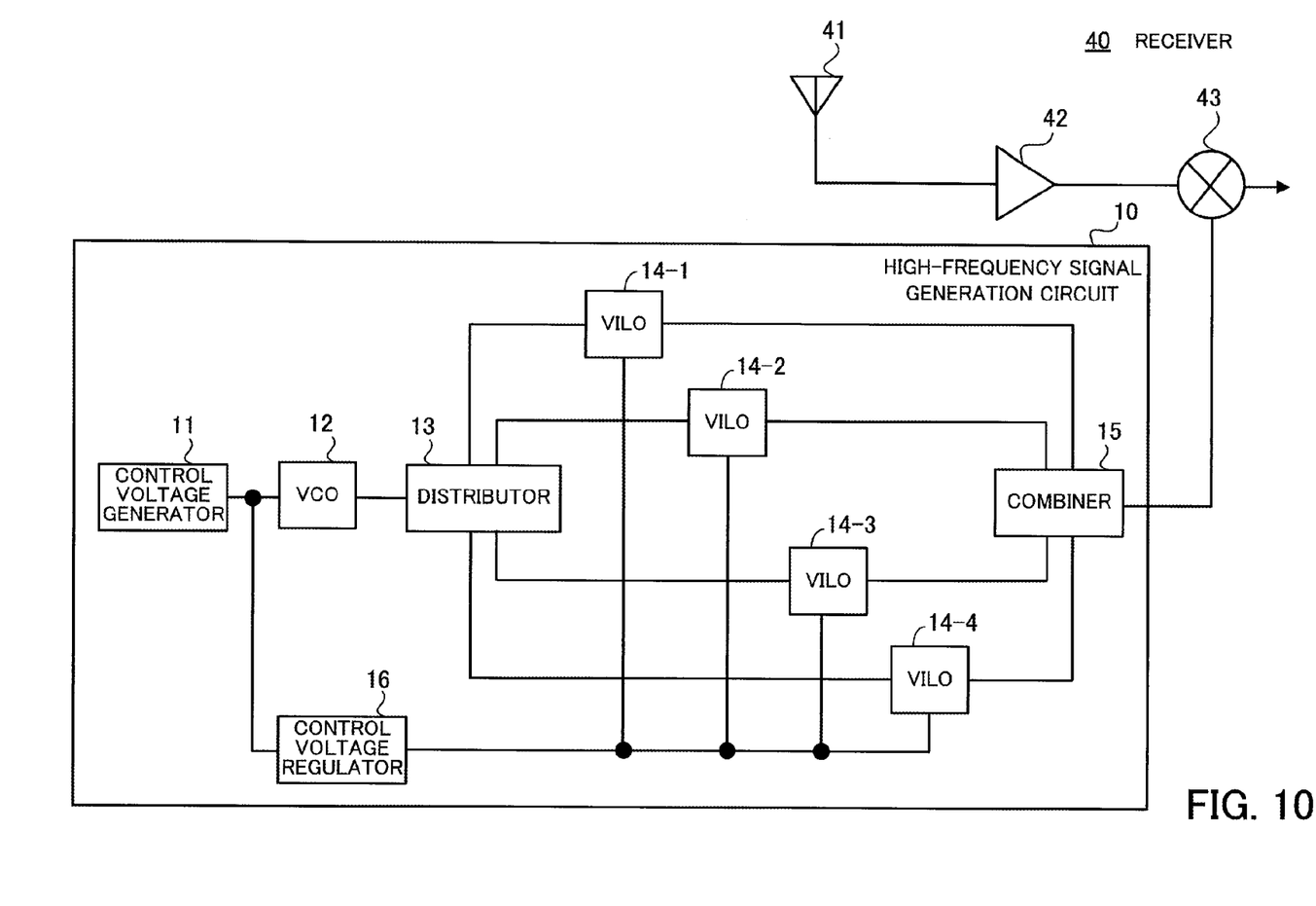
FIG. 10 illustrates another example in which a high-frequency signal generation circuit is applied.

FIG. 10 illustrates another example in which a high-frequency signal generation circuit is applied.

A receiver 40 includes a receiving antenna 41, a low-noise amplifier 42, a mixer 43, and a high-frequency signal generation circuit 10. The high-frequency signal generation circuit 10 is the same as the high-frequency signal generation circuit illustrated in FIG. 1A and is marked with the same numeral.

A signal received by the receiving antenna 41 is amplified by the low-noise amplifier 42, is inputted to the mixer 43, is multiplied by a signal outputted from the high-frequency signal generation circuit 10, and is outputted from the mixer 43 as a received signal. The high-frequency signal generation circuit 10 according to the embodiment is also applicable to a received local signal source which generates such a received signal.

With a receiver whose receiving sensitivity is high, a high-power local signal is required. According to the example illustrated in FIG. 10, the receiver 40 can generate a wideband high-power local signal and its power consumption is low. As a result, the power consumption of the receiver 40 is reduced.

In addition, the high-frequency signal generation circuit 10 is applicable to a transmitter-receiver.

Figure 11:
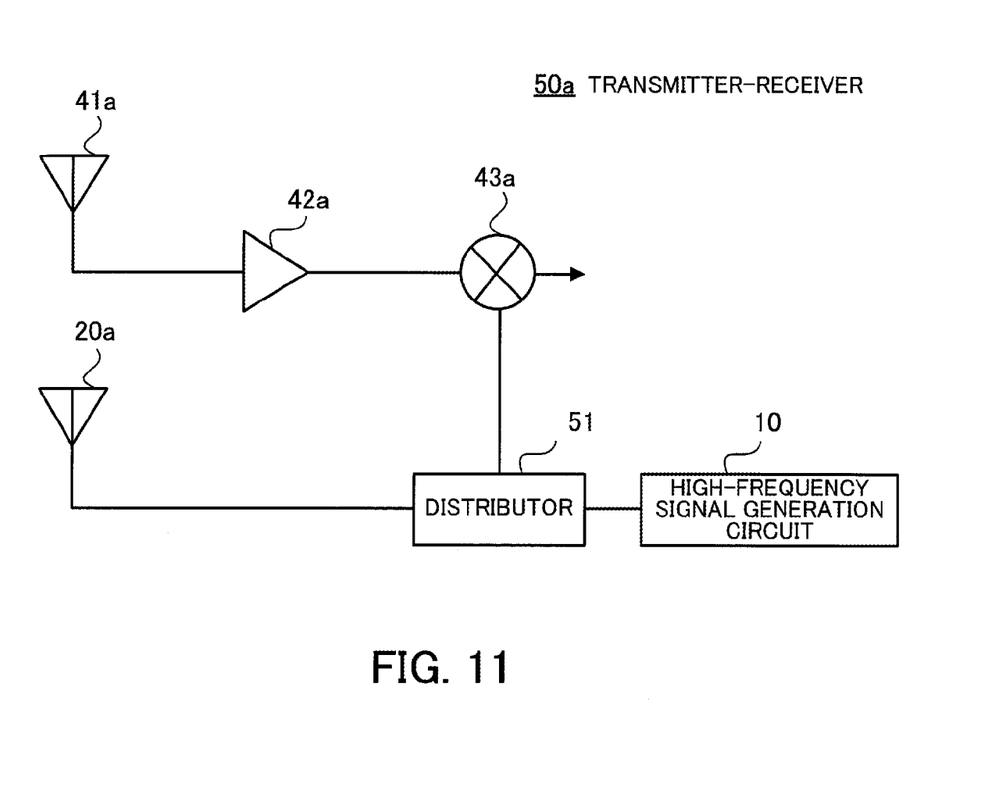
FIG. 11 illustrates an example in which a high-frequency signal generation circuit is applied to a transmitter-receiver.

FIG. 11 illustrates an example in which a high-frequency signal generation circuit is applied to a transmitter-receiver.

A transmitter-receiver 50a includes a receiving antenna 41a, a low-noise amplifier 42a, a mixer 43a, a transmission antenna 20a, a distributor 51, and a high-frequency signal generation circuit 10. The high-frequency signal generation circuit 10 is the same as the high-frequency signal generation circuit illustrated in FIG. 1A and is marked with the same numeral.

A signal outputted from the high-frequency signal generation circuit 10 is distributed by the distributor 51 into a received local signal and a transmitted signal. The received local signal is supplied to the mixer 43a. The transmitted signal is supplied to the transmission antenna 20a and is emitted from the transmission antenna 20a into space.

Figure 12:
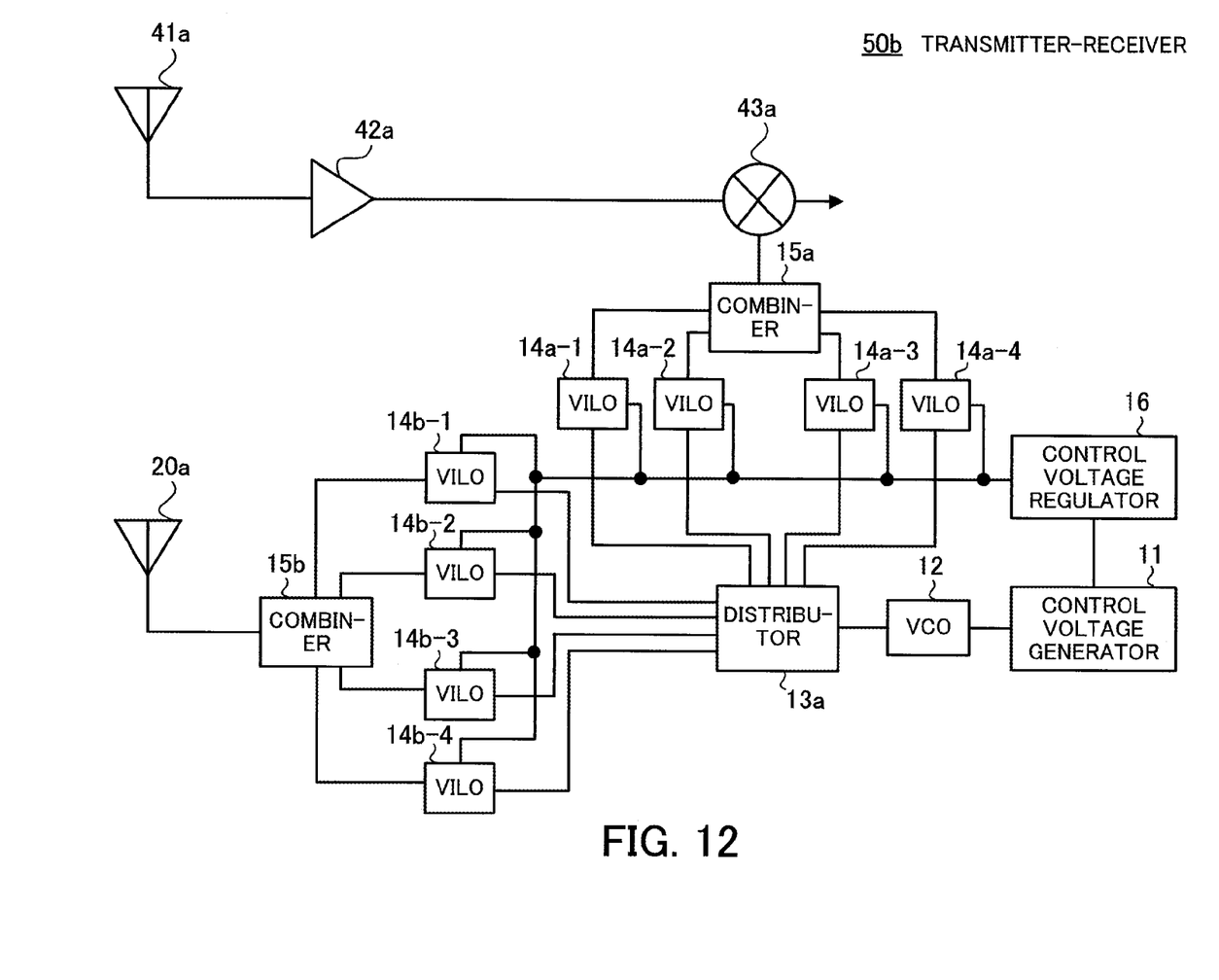
FIG. 12 illustrates another example in which a high-frequency signal generation circuit is applied to a transmitter-receiver.

FIG. 12 illustrates another example in which a high-frequency signal generation circuit is applied to a transmitter-receiver.

Components in FIG. 12 which are the same as those illustrated in FIG. 1A or 11 are marked with the same numerals.

In the above example the distributor 13 included in the high-frequency signal generation circuit 10 is for distributing a signal to the VILOs 14-1 through 14-4. In this example, however, a distributor 13a is also for distributing a signal into a received local signal and a transmitted signal.

A signal outputted from a VCO 12 is inputted to the distributor 13a. The distributor 13a supplies a signal to each of VILOs 14a-1, 14a-2, 14a-3, and 14a-4 arranged on a receiving local side and VILOs 14b-1, 14b-2, 14b-3, and 14b-4 arranged on a transmission side. A combiner 15a arranged on the receiving local side combines signals outputted from the VILOs 14a-1 through 14a-4, and supplies a local signal to a mixer 43a. On the other hand, a combiner 15b arranged on the transmission side combines signals outputted from the VILOs 14b-1 through 14b-4, and supplies a transmitted signal to a transmission antenna 20a.

According to the example illustrated in FIG. 11 or 12, the transmitter-receiver 50a or a transmitter-receiver 50b can generate a high-power transmitted signal and a high-power local signal and its power consumption is low. As a result, the power consumption of the transmitter-receiver 50a or 50b is reduced.

According to the disclosed high-frequency signal generation circuit, transmitter, receiver, and transmitter-receiver, it is possible to increase output power while preventing an operating band from narrowing.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A high-frequency signal generation circuit comprising:
a voltage controlled oscillator which outputs an output signal whose output frequency is controlled by a first control voltage;
a distributor which distributes the output signal outputted from the voltage controlled oscillator;
a plurality of injection-locked oscillators each of which regulates a self-oscillation frequency according to the output frequency and which output signals obtained by frequency-multiplying signals distributed by the distributor;
a combiner which combines and outputs the signals outputted from the plurality of injection-locked oscillators; and
a control voltage regulator which generates a second control voltage by regulating the first control voltage so as to make the self-oscillation frequency equal to M times the output frequency and which supplies the second control voltage to the plurality of injection-locked oscillators, the M being an integer greater than or equal to 2.

2. A transmitter comprising:
a voltage controlled oscillator which outputs an output signal whose output frequency is controlled by a first control voltage;
a distributor which distributes the output signal outputted from the voltage controlled oscillator;
a plurality of injection-locked oscillators each of which regulates a self-oscillation frequency according to the output frequency and which output signals obtained by frequency-multiplying signals distributed by the distributor;
a combiner which combines the signals outputted from the plurality of injection-locked oscillators;
a control voltage regulator which generates a second control voltage by regulating the first control voltage so as to make the self-oscillation frequency equal to M times the output frequency and which supplies the second control voltage to the plurality of injection-locked oscillators, the M being an integer greater than or equal to 2; and
an antenna which transmits a signal that is outputted from the combiner and that is obtained by combining the signals outputted from the plurality of injection-locked oscillators.

3. A receiver comprising:
a voltage controlled oscillator which outputs an output signal whose output frequency is controlled by a first control voltage;
a distributor which distributes the output signal outputted from the voltage controlled oscillator;
a plurality of injection-locked oscillators each of which regulates a self-oscillation frequency according to the output frequency and which output signals obtained by frequency-multiplying signals distributed by the distributor;
a combiner which combines the signals outputted from the plurality of injection-locked oscillators;
a control voltage regulator which generates a second control voltage by regulating the first control voltage so as to make the self-oscillation frequency equal to M times the output frequency and which supplies the second control voltage to the plurality of injection-locked oscillators, the M being an integer greater than or equal to 2;
an antenna which receives a signal;
an amplifier which amplifies the signal received by the antenna; and
a mixer which multiplies a signal amplified by the amplifier by a signal that is outputted from the combiner and that is obtained by combining the signals outputted from the plurality of injection-locked oscillators and which outputs a signal obtained.

* * * * *